(12) United States Patent
Macht

(10) Patent No.: US 12,385,957 B2
(45) Date of Patent: Aug. 12, 2025

(54) METHOD FOR COMPUTING AN INSULATION RESISTANCE IN AN UNGROUNDED DC POWER SUPPLY SYSTEM AT A CHANGEABLE DC LINE VOLTAGE

(71) Applicant: Bender GmbH & Co. KG, Gruenberg (DE)

(72) Inventor: Burkhard Macht, Hungen (DE)

(73) Assignee: Bender GmbH & Co. KG, Gruenberg (DE)

( * ) Notice: Subject to any disclaimer, the term of this patent is extended or adjusted under 35 U.S.C. 154(b) by 0 days.

(21) Appl. No.: 18/756,043

(22) Filed: Jun. 27, 2024

(65) Prior Publication Data

US 2025/0004025 A1    Jan. 2, 2025

(30) Foreign Application Priority Data

Jun. 28, 2023 (DE) ............ 10 2023 117 040.6

(51) Int. Cl.
*G01R 27/02* (2006.01)
*G01R 27/08* (2006.01)
*G01R 31/52* (2020.01)

(52) U.S. Cl.
CPC .......... *G01R 27/025* (2013.01); *G01R 27/08* (2013.01); *G01R 31/52* (2020.01)

(58) Field of Classification Search
CPC ...... G01R 27/00; G01R 27/02; G01R 27/025; G01R 27/08; G01R 31/00; G01R 31/50; G01R 31/52
(Continued)

(56) References Cited

U.S. PATENT DOCUMENTS 9,753,069 B2 * 9/2017 Liu ............... G01R 27/025
2018/0154776 A1   6/2018 Gardien

FOREIGN PATENT DOCUMENTS

DE   102012019094 A1   3/2014
DE   102012019095 A1   3/2014
(Continued)

*Primary Examiner* — Hoai-An D. Nguyen
(74) *Attorney, Agent, or Firm* — Dickinson Wright PLLC; Andrew D. Dorisio

(57) ABSTRACT

A method is provided for computing an insulation resistance ($R_f$) in an ungrounded DC power supply system (2) at a changeable DC line voltage ($U_{n1}$, $U_{n2}$). In two consecutive measurements at the point in time of the respective settled state of a first and second pulse amplitude ($U_{g1}$, $U_{g2}$) of a measuring voltage ($U_g$) superposed on the DC power supply system (2), the insulation resistance ($R_f$) is computed at a changed DC line voltage ($U_{n1}$, $U_{n2}$). In this context, a correction factor K is derived from a measured first and second total measuring current ($I_{m1}$, $I_{m2}$) and from the respective current first and second DC line voltage ($U_{n1}$, $U_{n2}$) in order to determine the measuring pulse current ($I_{g1}$, $I_{g2}$) required for computing the insulation resistance ($R_f$).

6 Claims, 3 Drawing Sheets

(58) Field of Classification Search
USPC ....... 324/600, 649, 691, 500, 537, 539, 541, 324/543, 544, 551, 557
See application file for complete search history.

(56) References Cited

FOREIGN PATENT DOCUMENTS

| | | | |
|---|---|---|---|
| DE | 102014204870 A1 | 9/2015 | |
| DE | 102014205877 A1 | 10/2015 | |
| DE | 102015102310 A1 | 8/2016 | |
| DE | 102023107987 B3 * | 7/2024 | ........... G01R 27/025 |
| JP | 2006220520 A * | 8/2006 | ............. G01R 27/16 |
| JP | 6220821 B2 | 10/2017 | |

* cited by examiner

METHOD FOR COMPUTING AN INSULATION RESISTANCE IN AN UNGROUNDED DC POWER SUPPLY SYSTEM AT A CHANGEABLE DC LINE VOLTAGE

This application claims priority to German Patent Application No. 10 2023 117 040.6 filed on Jun. 28, 2023, the disclosure of which is hereby incorporated by reference.

TECHNICAL FIELD

The invention relates to a method for computing an insulation resistance in an ungrounded DC power supply system at a changeable DC line voltage.

BACKGROUND

The network form of an ungrounded power supply system, which is also referred to as insulated network (isolé terre—IT) or as an IT (power supply) system, is used when higher requirements to the operational, fire and touch safety of electric installations must be fulfilled. In this type of power supply system, the active parts are isolated from the ground potential (to ground). The advantage of these networks is that the function of the connected electrical consumers is not impaired when an insulation fault, such as a ground fault or a short circuit to ground, occurs, as a circuit cannot become closed between an active conductor of the network and ground because of the ideally infinitely large impedance value.

Owing to this inherent safety of the ungrounded power supply system, a continuous power supply of the consumers fed by the ungrounded power supply system can consequently be ensured even if a first insulation fault arises.

The resistance of the ungrounded power supply system to ground (insulation resistance—also an insulation fault resistance or fault resistance in a fault event) is therefore continuously monitored, as a fault loop could arise due to another possible fault at another active conductor and the flowing fault current would result in a shut-down of the installation with an operational standstill in conjunction with an overcurrent protection device.

Provided that the insulation state of the ungrounded power supply system is continuously monitored, operation of this IT system can be continued without a stipulated temporal limitation even when a first fault has occurred.

To monitor the insulation resistance, insulation monitoring devices are used. Insulation monitoring devices known from the state of the art and from product norm IEC 61557-8 determine the insulation resistance of the entire IT system to ground. The insulation monitoring device is connected between the active conductors and ground and superposes a measuring voltage on the network (active measuring method). When an insulation fault has arisen, the measuring circuit closes between the network and ground via the insulation fault, meaning a measuring current dependent on the insulation resistance arises. This measuring current causes a corresponding voltage drop, which is evaluated by the electronics and leads to an alarm signal when a presettable threshold is exceeded, at a measuring resistance of a measuring path in the insulation monitoring device.

A standard insulation monitoring device of this kind installed in a DC power supply system is presumed as a system environment for the method for determining the insulation resistance as intended by the invention. In bipolar coupling, the observed insulation monitoring device has a measuring path between each one of the active conductors of the DC power supply system to ground, the measuring path comprising a series connection having a coupling resistance, a measuring resistance and a shared measuring voltage generator for generating a measuring voltage.

The determination of the measuring current can, however, be distorted by parasitics, as other current portions flow via the measuring path aside from the measuring current driven by the superposition of the active measuring voltage.

In order to counteract measuring faults caused by external DC voltages or large system leakage capacitances, it is known from the state of the art to connect a periodic square measuring pulse voltage as a measuring voltage instead of a direct measuring voltage, the periodic square measuring pulse voltage having a first pulse amplitude and a second pulse amplitude as a measuring signal (pulse measuring method).

Also known are measuring methods in which a special pulsed measuring pulse voltage with adapted measuring pulses and/or variable clock cycles is used in order to be able to differentiate between system leakage current portions which can arise as disturbance values and a measuring pulse current caused by the measuring pulse voltage for computing the ohmic insulation resistance (fault resistance).

In DC power supply systems, however, the measurement using adaptive measuring pulses can also lead to faulty measurements should the DC line voltage between two settled states have changed.

The DC portion contained in the total measuring current and caused by the DC line voltage can then no longer be removed correctly from the equation because of the DC line voltage change, meaning a measuring error results. A typical example for the case of a change of the DC line voltage is a PV installation during clouding, for instance via rapidly changing shading due to cloudiness.

A step to avoid parasitics from changeable operational voltages is known from DE 10 2014 205 877 A1. In this application document, the monitoring of the insulation in an onboard network of a vehicle is described. The insulation resistance is detected in a unipolar coupling via a current path, the insulation resistance being iteratively computed and a dimension-less correction value flowing into the computation for correcting an operational voltage difference.

DE 10 2014 204 870 A1 similarly shows the detection of the insulation resistance in a vehicle's onboard network, a third measurement being implemented at different operational voltages or a correction of the insulation resistance being executed while taking into consideration a correction factor gathered from a correction-factor table.

Both the iterative computation and a third measurement as well as the act of reading the correction value from a table seem to make the computation of the insulation resistance very complex.

SUMMARY

The object of the invention at hand is therefore to propose a method by means of which the insulation resistance can be efficiently and precisely computed at a changeable DC line voltage in an ungrounded DC power supply system.

For this purpose, a first and a second total measuring current is registered in a settled state of the first pulse amplitude and in a settled state of the second pulse amplitude, respectively, at the DC line voltage currently prevailing in each instance.

The total measuring current corresponds to the sum from the measuring pulse current to be detected driven by the measuring pulse voltage and from the line voltage current driven by the DC line voltage and occurring as a disturbance portion.

From the known first and second pulse amplitude, the measured first and second total measuring current and from the corresponding current first and second DC line voltage, a correction factor K is computed.

From the difference of the measured first total measuring current and the current first DC line voltage multiplied by the correction factor, a first measuring pulse current driven by the first pulse amplitude is subsequently computed.

Alternatively, a second measuring pulse can be computed in the same manner from the difference of the measured second total measuring current and the current second DC line voltage multiplied by the correction factor.

In conclusion, the insulation resistance is computed from the first pulse amplitude and the first measuring pulse current and from the coupling resistances and measuring resistances.

Alternatively, the insulation resistance is computed from the second pulse amplitude, the second measuring pulse current and the coupling resistances and the measuring resistances.

In two consecutive measurements at the point in time of the respective settled state of the first and the second pulse amplitude, the insulation resistance is correctly computed at a changed DC line voltage. Aside from the pulse amplitude, the measured total measuring current and the respective current DC line voltage are required in the respective settled state for computation.

In another embodiment, the correction factor is determined by computing a current difference from the first total measuring current multiplied by the ratio of the second pulse amplitude to the first pulse amplitude and from the second total measuring current, by computing a voltage difference from the current first DC line voltage multiplied by the ratio of the second pulse amplitude to the first pulse amplitude and from the second DC line voltage and by computing the correction factor as a quotient from the current difference and the voltage difference.

The insulation resistance is computed by computing a resistance quotient from the first or the second pulse amplitude and the respective first or second measuring pulse current and by computing a resistance difference as the insulation resistance from the difference of the resistance quotient and a measuring path resistance, the measuring path resistance being derived from the parallel connection of the series connections the of coupling resistance and the measuring resistance.

The insulation resistance can thus be computed either via the variables detected during the first measurement—in the settled state of the first pulse amplitude—or via the variables detected during the second measurement—in the settled state of the second pulse amplitude.

Preferably, the insulation resistance computed from the first measurement is compared to the insulation resistance computed from the second measurement.

The comparison of the two computed insulation resistance values allows making a statement on the reliability of the computation of the corresponding detected value. In this manner, a plausibility control can take place and outliers caused by measurement errors or parasitic induction can be eliminated.

BRIEF DESCRIPTION OF THE DRAWINGS

Further advantageous embodiment features are derived from the following description and the drawings which all describe a preferred embodiment of the invention by means of examples.

DETAILED DESCRIPTION

Figure 1:
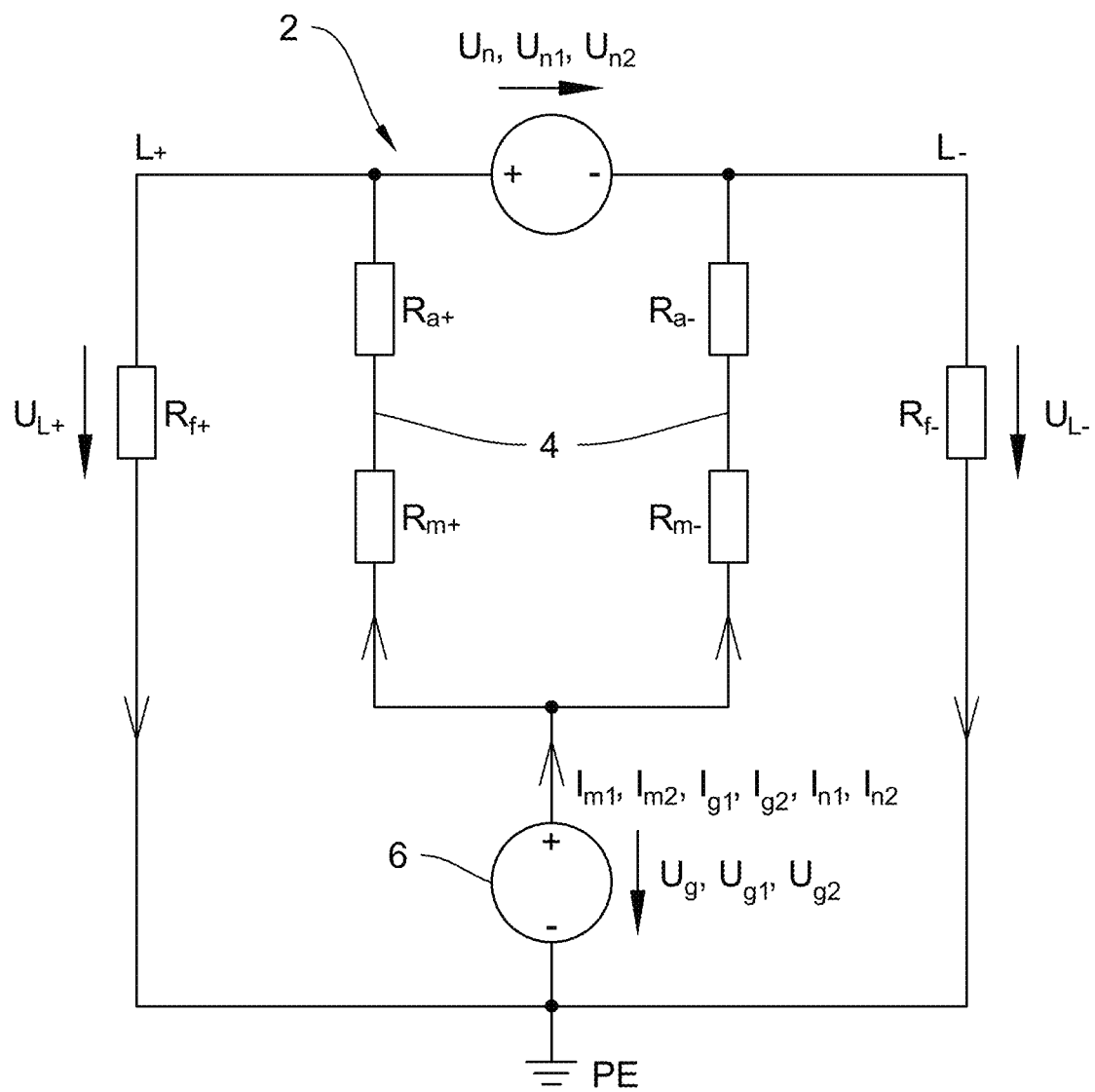
FIG. 1 shows a simplified diagram of an insulation resistance measurement in the ungrounded DC power supply system with bipolar coupling.

FIG. 1 shows the simplified structure of a circuit for insulation resistance measuring as it is implemented in a standard insulation monitoring device with bipolar coupling in an ungrounded DC power supply system 2.

DC power supply system 2 is fed by a DC line voltage $U_n$ which is changeable contingent on parasitic inductions and adopts the voltage values $U_{n1}$, $U_{n2}$ at two consecutive measuring points in time in this case, for example.

DC power supply system 2 has two active conductors $L_+$, $L_-$, between each of which an insulation resistance $R_{f+}$, $R_{f-}$ to ground PE is measurable. Between each active conductor $L_+$, $L_-$, a conductor-to-ground voltage $U_{L+}$, $U_{L-}$ settles, from whose measurement the respective current first or second DC line voltage $U_{n1}$, $U_{n2}$ is determined according to $$U_n = U_{L+} - U_{L-}$$

Between active conductors $L_+$, $L_-$ and ground, a measuring path 4 is installed in each instance for monitoring the insulation resistance, measuring path 4 having a coupling resistance $R_{a+}$, $R_{a-}$, a measuring resistance $R_{n+}$, $R_{n-}$ and a shared measuring voltage generator 6 for generating a measuring pulse voltage $U_g$ having a first pulse amplitude $U_{g1}$ and a second pulse amplitude $U_{g2}$.

Via both measuring paths 4 and shared measuring voltage generator 6 flows a first or second total measuring current $I_{m1}$, $I_{m2}$ which correspond to the first or the second measuring point in time and are each composed of a measuring pulse current $I_{g1}$, $I_{g2}$ driven by first or second pulse amplitude $U_{g1}$, $U_{g2}$ and a line-voltage current $I_{n1}$, $I_{n2}$ driven by DC line voltage $U_{n1}$, $U_{n2}$ and acting as a parasitic current.

Figure 2:
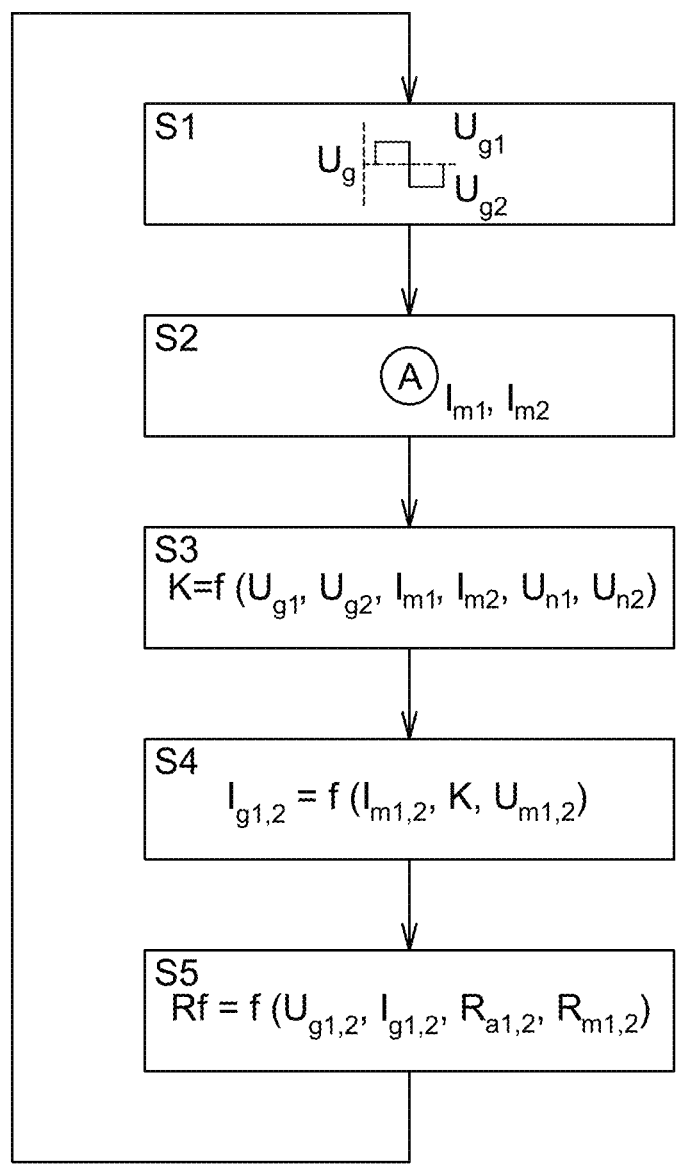
FIG. 2 shows a flow diagram of the method according to the invention.

FIG. 2 shows a flow diagram of the method according to the invention.

In step S1, a periodic square measuring pulse voltage $U_g$ having a first pulse amplitude $U_{g1}$ and a second pulse amplitude $U_{g2}$ is applied.

In step S2, respective total measuring current $I_{m1}$, $I_{m2}$ is measured in the settled state of first pulse amplitude $U_{g1}$ and second pulse amplitude $U_{g2}$ at first or second DC line voltage $U_{n1}$, $U_{n2}$ currently prevalent at the measuring point in time.

In step S3, a correction factor K is computed as a quotient from a current difference $I_d$ and a voltage difference $U_d$ according to $$K = \frac{I_d}{U_d}$$

-continued with $$I_d = \frac{U_{g2}}{U_{g1}} * I_{m1} - I_{m2}$$

and $$U_d = \frac{U_{g2}}{U_{g1}} * U_{n1} - U_{n2}$$

For the symmetrical pulse amplitudes with $U_{g1}=-U_{g2}$, the expression can be simplified to the following for computing computation factor K $$K = \frac{I_{m1} + I_{m2}}{U_{n1} + U_{n2}}$$

Measured first total measuring current $I_{m1}$ and measured second total measuring current $I_{m2}$ are each composed of first measuring pulse current $I_{g1}$ driven by first pulse amplitude $U_{g1}$ or second pulse amplitude $U_{g2}$ or second measuring pulse current $I_{g2}$ and of first or second line-voltage current $I_{n1}$ and $I_{n2}$ driven by respective current first or second DC line voltage $U_{n1}$, $U_{n2}$:

$$I_{m1} = I_{g1} + I_{n1} \Leftrightarrow I_{m1} = I_{g1} + K * U_{n1}$$

$$I_{m2} = I_{g2} + I_{n2} \Leftrightarrow I_{m2} = I_{g2} + K * U_{n2}$$

Correction factor K possesses the dimension of an electric conductance and thus corrects, when multiplied with appropriate DC line voltage $U_{n1}$, $U_{n2}$, total measuring current $I_{m1}$, $I_{m2}$ in step S4, whereby respective measuring pulse current $I_{g1}$, $I_{g2}$ driven exclusively by measuring pulse voltage $U_g$ can be detected:

$$I_{g1} = I_{m1} - K * U_{n1}$$

$$I_{g2} = I_{m2} - K * U_{n2}$$

In conclusion in step 5, insulation resistance $R_f$ is computed for the first measuring point in time as $R_{f1}$ from a resistance difference of a resistance quotient $U_{g1}/I_{g1}$ and a measuring path resistance $R_a/2$:

$$R_{f1} = \frac{U_{g1}}{I_{g1}} - \frac{R_a}{2},$$

measuring path resistance $R_a/2$ with $R_a=R_{a+}+R_{m+}$ being yielded from the parallel connection (bipolar coupling) of series connections (measuring path) of respective coupling resistance $R_{a+}$, $R_{a-}$ and respective measuring resistance $R_{m+}$, $R_{m-}$.

Analogously, insulation resistance $R_f$ is determined as $R_{f2}$ from the second measurement:

$$R_{f2} = \frac{U_{g2}}{I_{g2}} - \frac{R_a}{2},$$

meaning $R_f=R_{f1}=R_{f2}$ applies.

Figure 3:
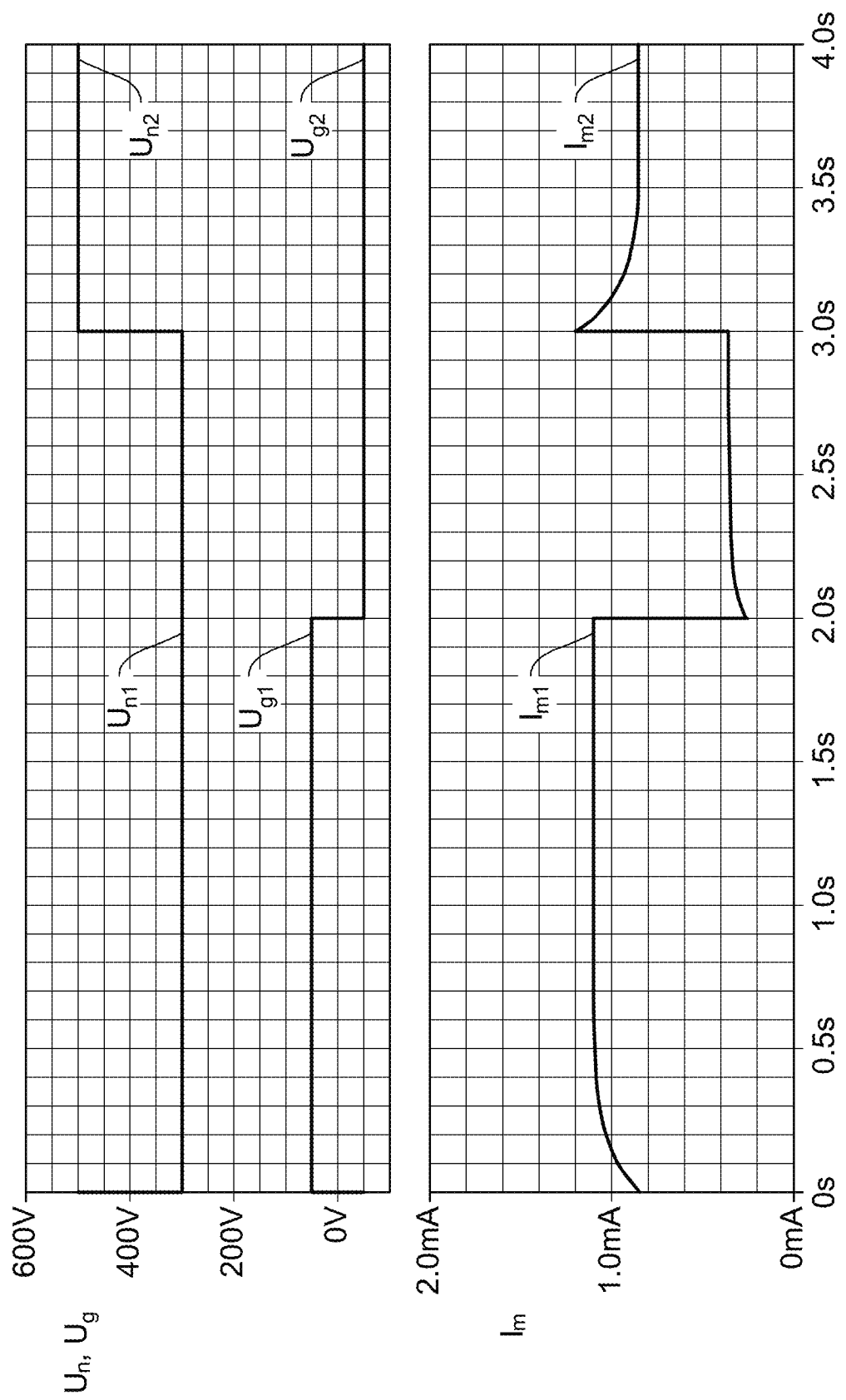
FIG. 3 shows measuring and simulation results.

FIG. 3 and the following tables show the voltage and current curves with first and second pulse amplitude $U_{g1}$, $U_{g2}$ of measuring voltage $U_g$, respective DC line voltages $U_{n1}$, $U_{n2}$ and measured first total measuring current $I_{m1}$ and second total measuring current $I_{m2}$ and measuring simulation results.

| DC line voltage constant: $U_{n1} = U_{n2} = 300$ V | | | | | |
|---|---|---|---|---|---|
| $U_{n1}$/V | $U_{g1}$/V | $I_{m1}$/mA | $U_{n2}$/V | $U_{g2}$/V | $I_{m2}$/mA |
| 300 | 50 | 1.098 | 300 | −50 | 0.366 |
| K | $I_{g1}$/mA | $R_{f1}/\Omega$ | OR | $I_{g2}$/mA | $R_{f2}/\Omega$ |
| 2.43883E−06 | 0.36595 | 16.6 | | −0.3660 | 16.6 |

| DC line voltage changeable: $U_{n1} = U_{n2} = 300$ V | | | | | |
|---|---|---|---|---|---|
| $U_{n1}$/V | $U_{g1}$/V | $I_{m1}$/mA | $U_{n2}$/V | $U_{g2}$/V | $I_{m2}$/mA |
| 300 | 50 | 1.098 | 500 | −50 | 0.854 |
| K | $I_{g1}$/mA | $R_{f1}/\Omega$ | OR | $I_{g2}$/mA | $R_{f2}/\Omega$ |
| 2.43977E−06 | 0.36567 | 16.7 | | −0.3657 | 16.7 |

It has shown that insulation resistance $R_f$ (with the difference of 0.1Ω) can be (nearly) correctly determined at a changeable DC line voltage $U_n$ after a jump in DC line voltage $U_n$ of $U_{n1}=300$ V to $U_{n2}=500$ V at t=3 s.

In this context, the computation can be implemented both for the first measuring point in time t=2 s (on the left side) in the settled state of first pulse amplitude $U_{g1}$ and for second measuring point in time t=4 s in the settled state of second pulse amplitude $U_{g2}$.

The invention claimed is:

1. A method for computing an insulation resistance ($R_f$) in an ungrounded DC power supply system (2) at a changeable DC line voltage ($U_{n1}$, $U_{n2}$), a measuring path being installed between each active conductor ($L_+$, $L_-$) of the DC power supply system (2) to ground (PE), the measuring path (4) having a series connection having a coupling resistance ($R_{a+}$, $R_{a-}$), a measuring resistance ($R_{m+}$, $R_{m-}$) and a measuring-voltage generator (6) for generating a measuring pulse voltage ($U_g$), the method comprising the following steps:

switching a periodic square measuring pulse voltage ($U_g$) having a first pulse amplitude ($U_{g1}$) and a second pulse amplitude ($U_{g2}$),
whereby
measuring a first total measuring current ($I_{m1}$) in a settled state of the first pulse amplitude ($U_{g1}$) at a current first DC line voltage ($U_{n1}$), and measuring a second total measuring current ($I_{m2}$) in a settled state of the second pulse amplitude ($U_{g2}$) at a current second DC line voltage ($U_{n2}$);

computing a correction factor (K) from the first pulse amplitude ($U_{g1}$) and the second pulse amplitude ($U_{g2}$), the first total measuring current ($I_{m1}$) and the second total measuring current ($I_{m2}$) and the current first DC line voltage ($U_{n1}$) and the second DC line voltage ($U_{n2}$);

computing a first measuring pulse current ($I_{g1}$) driven by the first pulse amplitude ($U_{g1}$) from the difference of the measured first total measuring current ($I_{m1}$) and the current first DC line voltage ($U_{n1}$) multiplied by the correction factor (K), or computing a second measuring pulse current ($I_{g2}$) driven by the second pulse amplitude ($U_{g2}$) from the difference of the measured second total measuring current ($I_{m2}$) and the current second DC line voltage ($U_{n2}$) multiplied by the correction factor (K); and computing the insulation resistance ($R_f$) from the first pulse amplitude ($U_{g1}$), the first measuring pulse current ($I_{g1}$), the coupling resistances ($R_{a+}$, $R_{a-}$) and the measuring resistances ($R_{m+}$, $R_{m-}$), or computing the insulation resistance ($R_f$) from the second pulse amplitude ($U_{g2}$), the second measuring pulse current ($I_{g2}$), the coupling resistances ($R_{a+}$, $R_{a-}$) and the measuring resistances ($R_{m+}$, $R_{m-}$).

2. The method according to claim 1, wherein the correction factor (K) is determined using the following method steps:

computing a current difference ($I_d$) from the first total measuring current ($I_{m1}$) multiplied by the ratio ($U_{g2}/U_{g1}$) of the second pulse amplitude ($U_{g2}$) to the first pulse amplitude ($U_{g1}$) and from the second total measuring current ($I_{m2}$);

computing a voltage difference ($U_d$) from the current first DC line voltage ($U_{n1}$) multiplied by the ratio of the second pulse amplitude ($U_{g2}$) to the first pulse amplitude ($U_{g1}$) and from the second line voltage ($U_{n2}$); and computing the correction factor (K) as a quotient ($I_d/U_d$) from the current difference ($I_d$) and the voltage difference ($U_d$).

3. The method according to claim 1, wherein the insulation resistance ($R_f$) is computed in the following steps:

computing a resistance quotient ($U_{g1}/I_{g1}$, $U_{g2}/I_{g2}$) from the first or the second pulse amplitude ($U_{g1}$, $U_{g2}$) and the respective first or second measuring pulse current ($I_{g1}$, $I_{g2}$); and computing a resistance difference as an insulation resistance ($R_f$, $R_{f1}$, $R_{f2}$) from the difference of the resistance quotient ($U_{g1}/I_{g1}$) and a measuring path resistance ($R_d/2$), the measuring path resistance ($R_d/2$) resulting from the parallel connection of the series connections ($R_{a+}+$, $R_{m+}$, $R_{a-}+$, $R_{m-}$) of the coupling resistance ($R_{a+}$, $R_{a-}$) and the measuring resistance ($R_{m+}$, $R_{m-}$).

4. The method according to claim 3, wherein the insulation resistance ($R_{f1}$) computed from the first measurement ($U_{g1}$, $I_{g1}$) is compared to the insulation resistance ($R_{f2}$) computed from the second measurement ($U_{g2}$, $I_{g2}$).

5. The method according to claim 2, wherein the insulation resistance ($R_f$) is computed in the following steps:

computing a resistance quotient ($U_{g1}/I_{g1}$, $U_{g2}/I_{g2}$) from the first or the second pulse amplitude ($U_{g1}$, $U_{g2}$) and the respective first or second measuring pulse current ($I_{g1}$, $I_{g2}$); and computing a resistance difference as an insulation resistance ($R_f$, $R_{f1}$, $R_{f2}$) from the difference of the resistance quotient ($U_{g1}/I_{g1}$) and a measuring path resistance ($R_d/2$), the measuring path resistance ($R_d/2$) resulting from the parallel connection of the series connections ($R_{a+}+$, $R_{m+}$, $R_{a-}+$, $R_{m-}$) of the coupling resistance ($R_{a+}$, $R_{a-}$) and the measuring resistance ($R_{m+}$, $R_{m-}$).

6. The method according to claim 5, wherein the insulation resistance ($R_{f1}$) computed from the first measurement ($U_{g1}$, $I_{g1}$) is compared to the insulation resistance ($R_{f2}$) computed from the second measurement ($U_{g2}$, $I_{g2}$).

* * * * *